United States Patent
Bouche et al.

(10) Patent No.: US 9,502,293 B2
(45) Date of Patent: Nov. 22, 2016

(54) SELF-ALIGNED VIA PROCESS FLOW

(71) Applicant: GLOBALFOUNDRIES Inc., Grand Cayman (KY)

(72) Inventors: Guillaume Bouche, Albany, NY (US); Andy C. Wei, Queensbury, NY (US); Sudharshanan Raghunthathan, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/543,992

(22) Filed: Nov. 18, 2014

(65) Prior Publication Data

US 2016/0141206 A1  May 19, 2016

(51) Int. Cl.
*H01L 21/768* (2006.01)
*H01L 23/522* (2006.01)
*H01L 23/528* (2006.01)

(52) U.S. Cl.
CPC ..... *H01L 21/76897* (2013.01); *H01L 21/7682* (2013.01); *H01L 21/76819* (2013.01); *H01L 21/76877* (2013.01); *H01L 23/5226* (2013.01); *H01L 23/5283* (2013.01)

(58) Field of Classification Search
CPC .......... H01L 21/76897; H01L 21/76819; H01L 21/7682; H01L 21/76877; H01L 23/5226; H01L 23/5283; H01L 438/652; H01L 2224/13075; H01L 2224/1354; H01L 2224/29075; H01L 2224/2954; H01L 23/53223; H01L 21/76841; H01L 23/53266; H01L 28/75; H01L 29/4933; H01L 29/4941; H01L 33/0037; H01L 41/0815; H01L 438/666; H01L 2224/1405

See application file for complete search history.

(56) References Cited

U.S. PATENT DOCUMENTS

| | | | |
|---|---|---|---|
| 5,512,514 A * | 4/1996 | Lee | H01L 21/76885 148/DIG. 106 |
| 2003/0127740 A1 | 7/2003 | Hsu | |
| 2009/0093100 A1 | 4/2009 | Xia | |
| 2009/0093112 A1 | 4/2009 | Al-Bayati | |
| 2014/0131883 A1 | 5/2014 | Huang | |

OTHER PUBLICATIONS

Translation of Taiwanese Office Action dated Aug. 1, 2016. for Taiwanese patent application No. 104129901, filed on Sep. 10, 2015.

\* cited by examiner

*Primary Examiner* — Julio J Maldonado
*Assistant Examiner* — Farun Lu
(74) *Attorney, Agent, or Firm* — Amerson Law Firm, PLLC

(57) ABSTRACT

A method includes forming a first dielectric layer having at least one conductive feature embedded therein. A first plurality of conductive lines embedded in a second dielectric layer disposed above the first dielectric layer is formed. A first conductive line in the plurality of conductive lines contacts the conductive feature. The first conductive line is etched using a first etch mask to define a conductive via portion and a recessed line portion in the first conductive line. A second plurality of conductive lines embedded in a third dielectric layer disposed above the second dielectric layer is formed. A second conductive line in the second plurality of conductive lines contacts the conductive via portion and the third dielectric layer directly contacts the second dielectric layer.

14 Claims, 7 Drawing Sheets

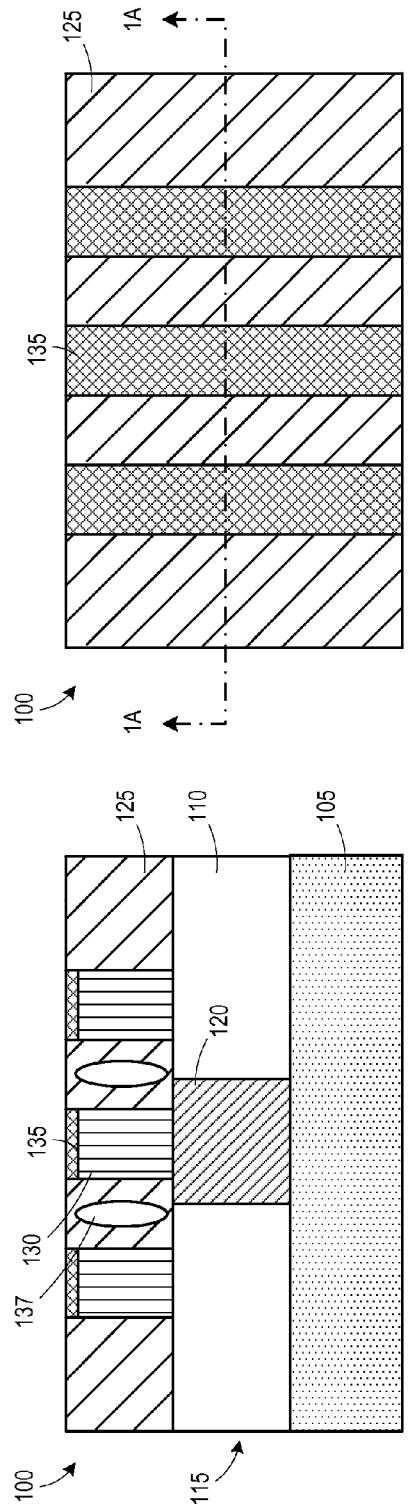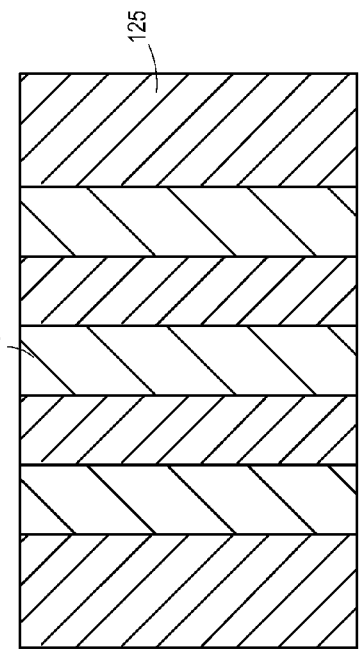
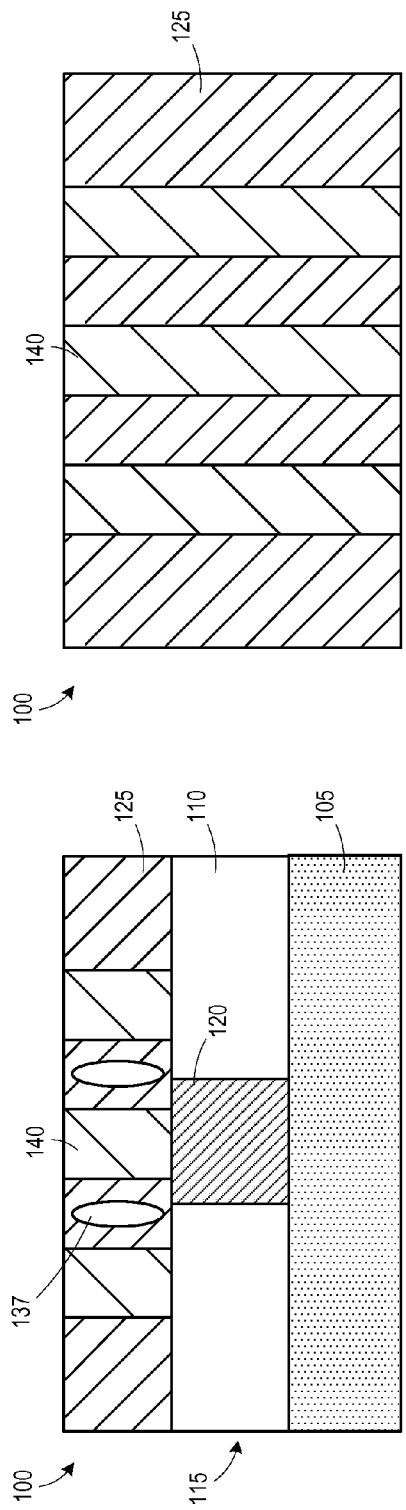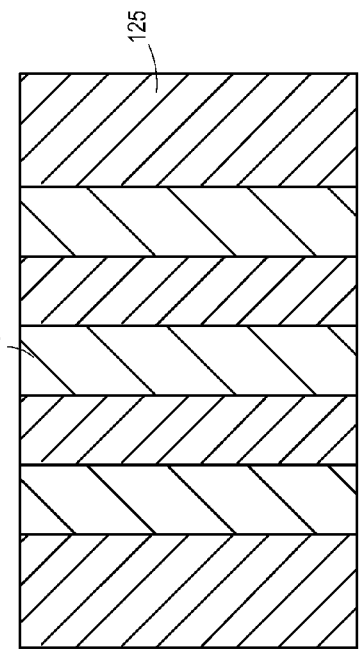

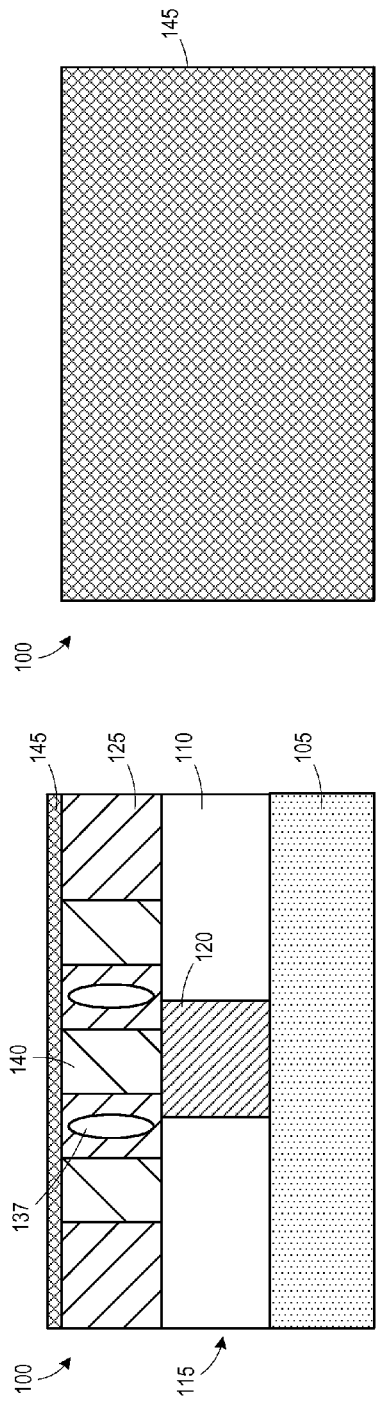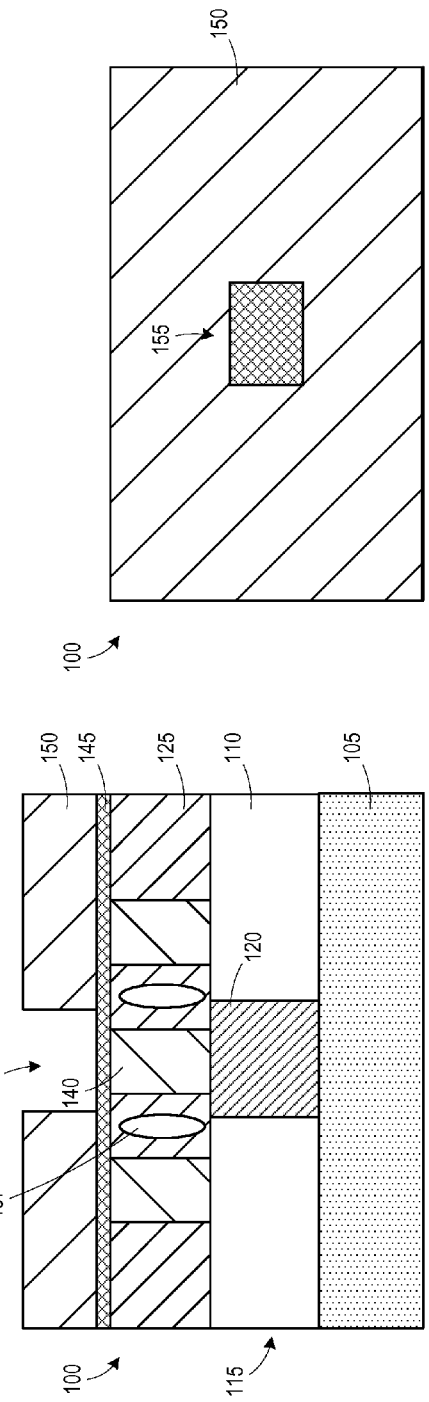

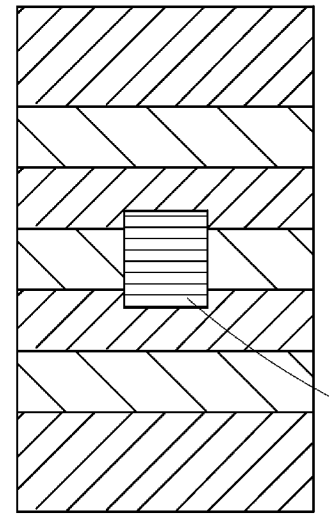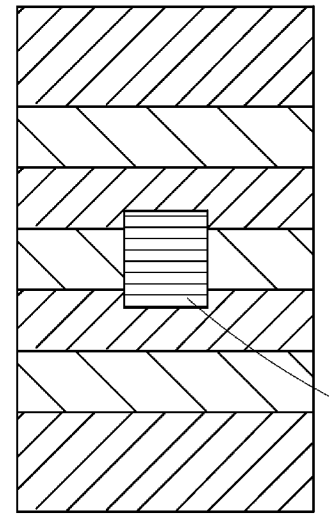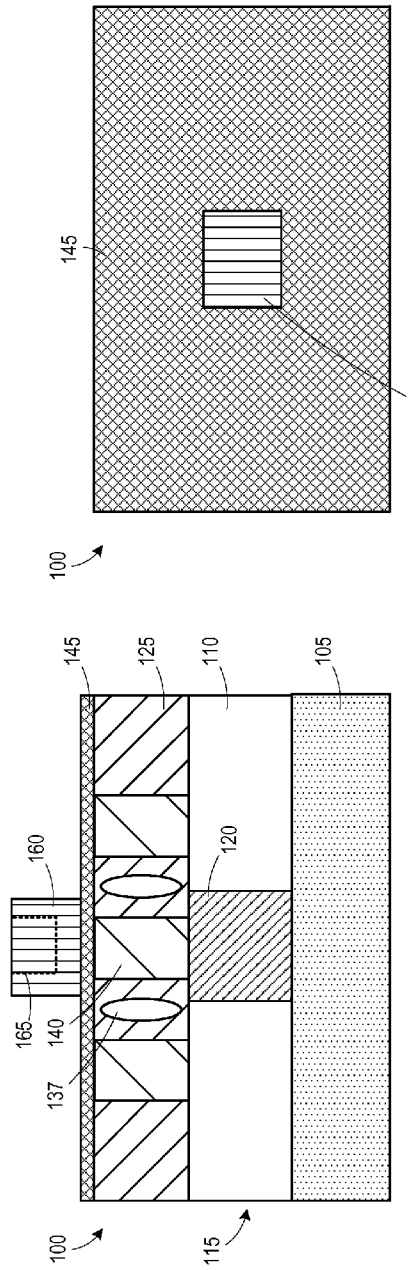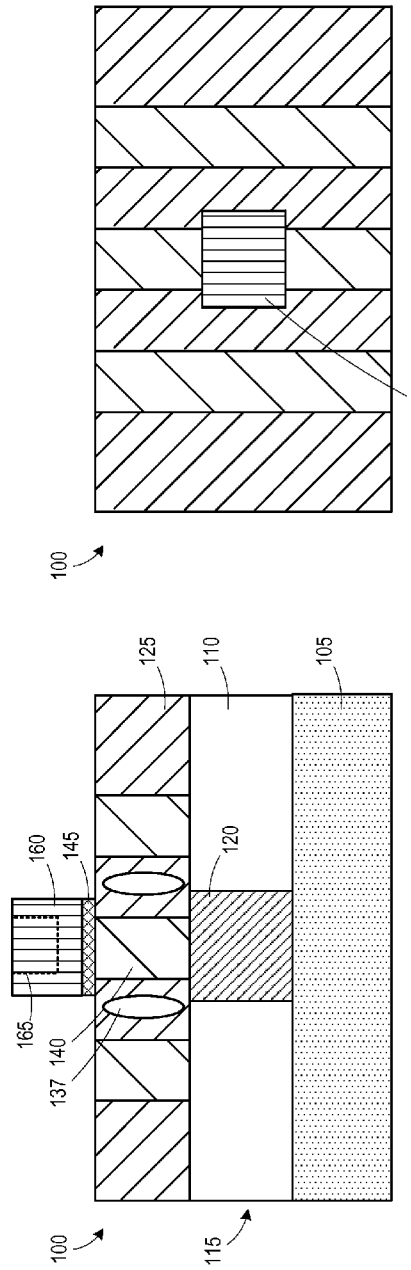

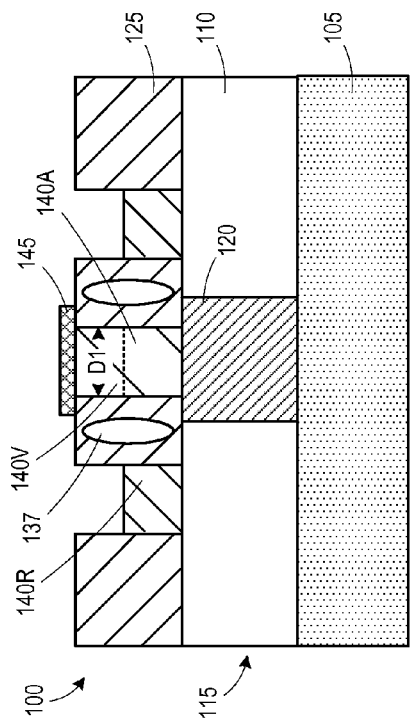
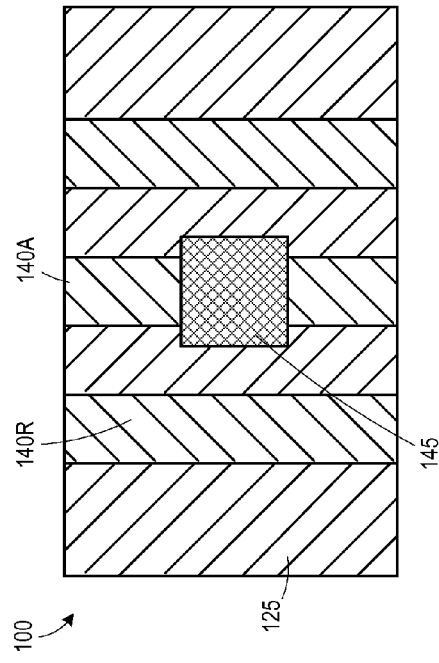
Figure 1G
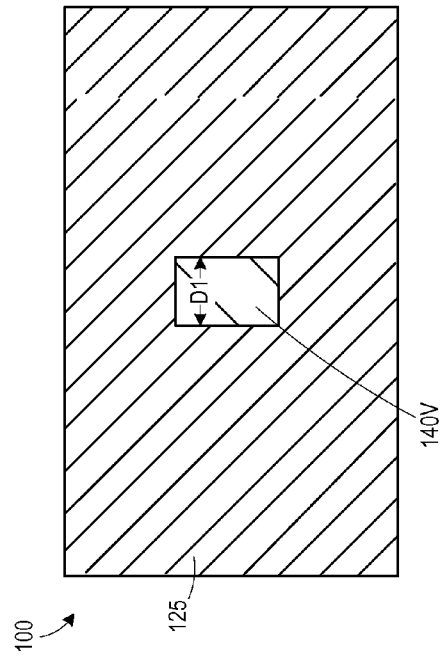
Figure 2G
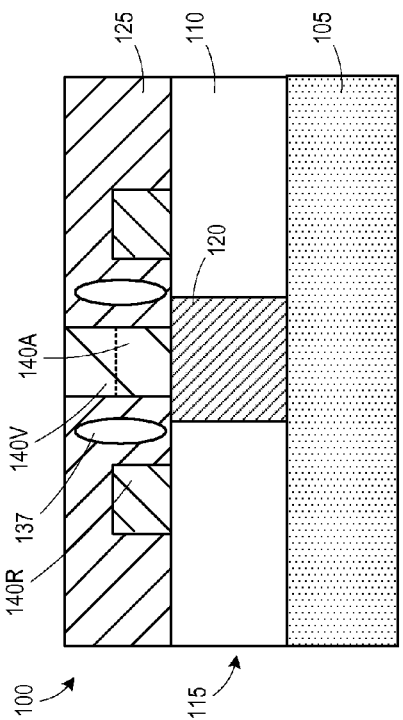
Figure 1H
Figure 2H

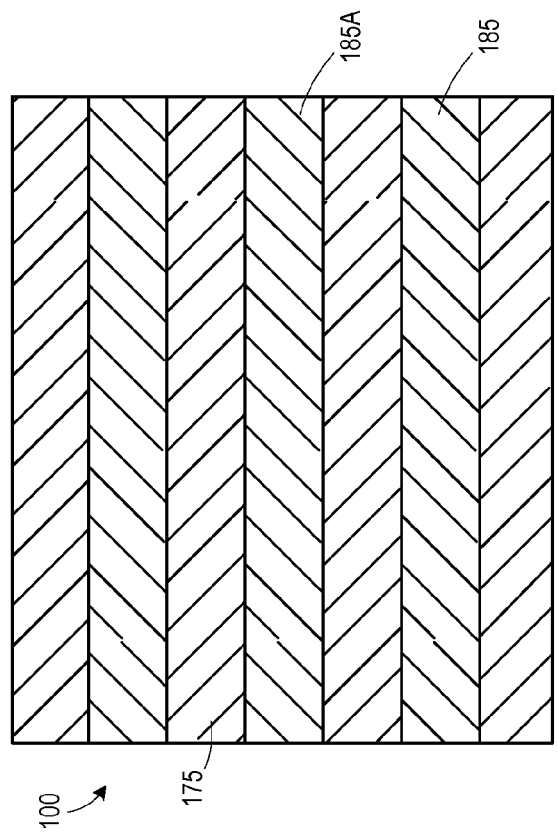
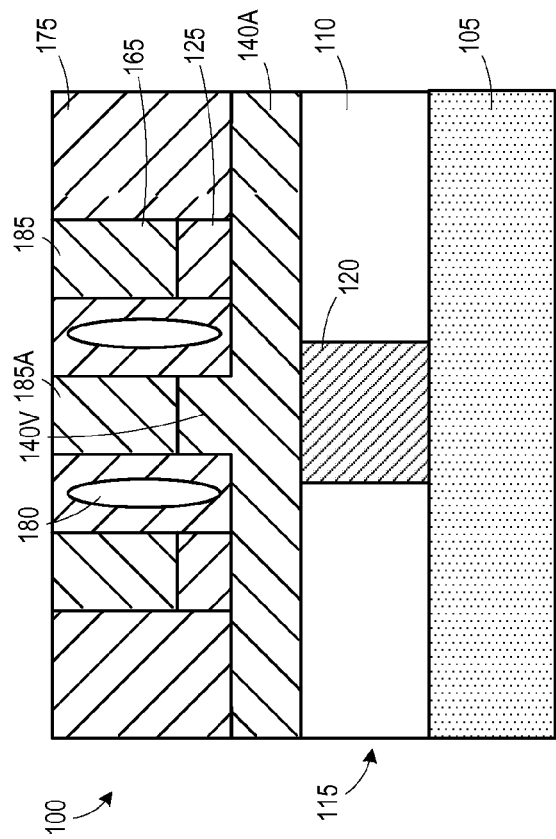

SELF-ALIGNED VIA PROCESS FLOW

BACKGROUND OF THE INVENTION

1. Field of the Invention

The present disclosure generally relates to the fabrication of semiconductor devices, and, more particularly, to a self-aligned process flow for forming vias.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

In such modern integrated circuits, a limiting factor of device performance is the signal propagation delay caused by the switching speed of the transistor elements. As the channel length of these transistor elements has now reached 50 nm and less, the signal propagation delay is no longer limited by the field effect transistors. Rather, the signal propagation delay is limited, owing to the increased circuit density, by the interconnect lines, since the line-to-line capacitance (C) is increased and also the resistance (R) of the lines is increased due to their reduced cross-sectional area. The parasitic RC time constants and the capacitive coupling between neighboring metal lines, therefore, require the introduction of a new type of material for forming the metallization layers.

Traditionally, metallization layers, i.e., the wiring layers including metal lines and vias for providing the electrical connection of the circuit elements according to a specified circuit layout, are formed by embedding copper lines and vias in a dielectric layer stack. For highly sophisticated applications, in addition to using copper and/or copper alloys, the well-established and well-known dielectric materials silicon dioxide (k≈4.2) and silicon nitride (k>7) may increasingly be replaced by so-called low-k dielectric materials having a relative permittivity of approximately 3.0 and less.

In addition, the continuous reduction of the feature sizes with gate lengths of approximately 40 nm and less may demand for even more reduced dielectric constants of the corresponding dielectric materials. For this reason, it has been proposed to introduce "air gaps," at least at critical device areas, since air or similar gases may have a dielectric constant of approximately 1.0.

Process flows for forming air gaps and multiple metallization layers are complex. The formation of the multiple metallization layers often requires the use of cap layers, such as silicon nitride, between the layers. Since the cap layer material has a dielectric constant higher than the low-k dielectric layer, the overall capacitance of the stack is increased, thereby reducing the maximum achievable switching speed.

The present disclosure is directed to various methods for forming vias and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming an interconnect structure. A method includes, among other things, forming a first dielectric layer having at least one conductive feature embedded therein. A first plurality of conductive lines embedded in a second dielectric layer disposed above the first dielectric layer is formed. A first conductive line in the plurality of conductive lines contacts the conductive feature. The first conductive line is etched using a first etch mask to define a conductive via portion and a recessed line portion in the first conductive line. A second plurality of conductive lines embedded in a third dielectric layer disposed above the second dielectric layer is formed. A second conductive line in the second plurality of conductive lines contacts the conductive via portion and the third dielectric layer directly contacts the second dielectric layer.

Another illustrative method includes, among other things, forming a first dielectric layer having at least one conductive feature embedded therein. A first conductive line embedded in a second dielectric layer disposed above the first dielectric layer is formed. The first conductive line contacts the conductive feature. A cap layer is formed above the second dielectric layer. A first mask is formed above a portion of the cap layer disposed above the first conductive line. The cap layer is etched to remove portions of the cap layer not covered by the first mask to define a second mask below the first mask based on a remaining portion of the cap layer. The first conductive line is etched using the second mask as an etch mask to define a conductive via portion and a recessed line portion in the first conductive line. A second conductive line embedded in a third dielectric layer disposed above the second dielectric layer is formed.

One illustrative device includes, among other things, a first dielectric layer having at least one conductive feature embedded therein. A first plurality of conductive lines is embedded in a second dielectric layer disposed above the first dielectric layer. A first conductive line in the plurality of conductive lines contacts the conductive feature and a conductive via portion and a recessed line portion are defined in the first conductive line. A second plurality of conductive lines are embedded in a third dielectric layer disposed above the second dielectric layer. A second conductive line in the second plurality of conductive lines contacts the conductive via portion, and the third dielectric layer directly contacts the second dielectric layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1M are cross-sectional views of a device depicting methods disclosed herein for forming vias; and FIGS. 2A-2M are top views of the device corresponding to FIGS. 1A-1M.

Figure 1I:
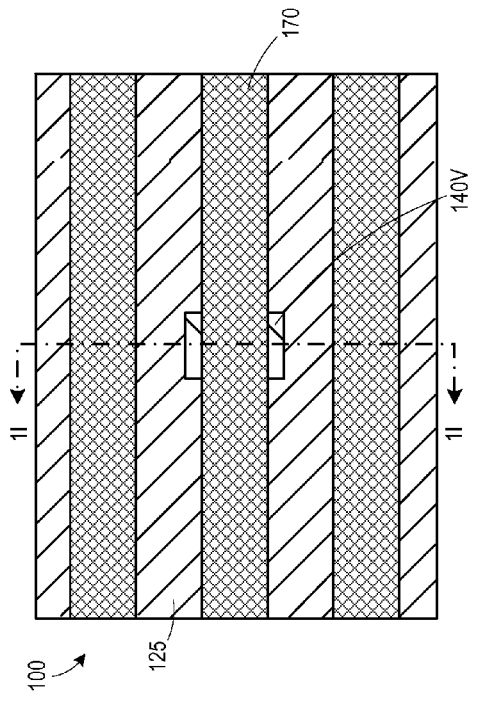

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming via structures and the resulting semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 1A-1M and 2A-2M illustrate a method for forming vias in a device 100 using a self-aligned process. FIGS. 1A-1M show cross-sectional views of the device 100 and FIGS. 2A-2M show corresponding top views of the device 100. The orientation of FIG. 1A is indicated by the center line in FIG. 2A. The device 100 includes a substrate 105. A dielectric layer 110 is formed above the substrate 105. The dielectric layer 110 may be part of a device layer 115 in which semiconductor-based circuit elements may be provided. For convenience, any such circuit elements are not shown in FIG. 1A. The substrate 105 may also include any appropriate microstructure features, such as micromechanical components, optoelectronic components and the like, wherein at least some of these components may require an interconnect structure formed in a metallization system. The device layer 115 includes a simplistically depicted conductive feature 120 (e.g., a contact) formed in the dielectric layer 110 for contacting underlying devices, such as the source/drain regions or the gate structure of a transistor (not shown). In the case of a gate contact, the conductive feature 120 would not extend all the way to the substrate 105. A dielectric layer 125 is formed above the device layer 115 (e.g., in a Metal 1 (M1) layer). The dielectric layer 125 may be a low-k dielectric material having a dielectric constant of approximately 3.0 or lower or an ultra-low-k (ULK) material having a dielectric constant of approximately 2.5 or lower. In some embodiments, the dielectric layer 125 may be SiOC. Sacrificial lines 130 (e.g., amorphous silicon) with a cap layer 135 (e.g., silicon nitride) are formed in the dielectric layer 125. The sacrificial lines 130 may be formed by patterning a layer of material (e.g., amorphous silicon) using a patterning process (e.g., self-aligned double patterning (SADP), self-aligned quad patterning (SAQP), or directed self-assembly material patterning), the specifics of which are known to those of ordinary skill in the art. The dielectric layer 125 may be deposited over the sacrificial lines 130 and planarized using the cap layer 135 as an etch stop layer. Due to the aspect ratio of the openings defined between the sacrificial lines 130, the dielectric layer 125 may not completely fill the openings, resulting in air gaps 137 being formed between the sacrificial lines 130.

FIGS. 1B and 2B illustrate the device 100 after several processes were performed to replace the sacrificial lines 130 with conductive material to define conductive lines 140. First, one or more etch processes were performed to remove the cap layer 135 and the sacrificial lines 130, resulting in the formation of recesses or openings in the dielectric layer 125. Next, one or more deposition processes were performed so as to over-fill the recesses with a conductive material. Then, a planarization process was performed to remove excess conductive material positioned above the dielectric layer 125. The conductive material may include multiple layers, such as one or more barrier layers (e.g., Ta, TaN, TiN, etc.) (not separately shown) to prevent migration of any metal in the conductive lines 140 into the dielectric layer 125, a metal seed layer (e.g., copper), and a metal fill material (e.g., copper).

FIGS. 1C and 2C illustrate the device 100 after a cap layer 145 (e.g., silicon nitride) was formed above the dielectric layer 125. FIGS. 1D and 2D illustrate the device 100 after several processes were performed to form a hard mask layer 150 (e.g., spin-on hard mask (SOH)) above the cap layer 145 and to pattern the hard mask layer 150 to define an opening 155. This scheme allows for a dense pattern using a sequence of successive lithography/etch processes into layer 150 using conventional lithography, thereby avoiding the need for more complicated processes, such as EUV lithography.

FIGS. 1E and 2E illustrate the device 100 after a sacrificial material 160 (e.g., amorphous carbon, DUO™ (offered commercially by Honeywell, Inc.), or any other material that can be selectively stripped from the material of the conductive lines 140) was formed in the opening 155 and the hard mask layer 150 was removed. Although the sacrificial material 160 is illustrated as having completely filled the opening 155, in some embodiments, the sacrificial material 160 may line the opening 155 without completely filling it. For example, a layer of the sacrificial material may be deposited and anisotropically etched to define spacers on sidewalls of the opening 155 and a bottom layer covering a bottom surface of the opening 155 (as denoted by feature 165 in FIG. 1E).

FIGS. 1F and 2F illustrate the device 100 after the cap layer 145 is etched using the sacrificial material 160 as an etch mask. FIGS. 1G and 2G illustrate the device 100 after a first removal process (e.g., etching or ashing) was performed to remove the sacrificial material 160 and an etch process was performed with the cap layer 145 in position to define recessed conductive lines 140R and a conductive via portion 140V. One of the recessed conductive lines 140A interfaces with the conductive via portion 140V. The cap layer 145 prevents recessing of the covered portion of the conductive line 140A thereby resulting in the formation of the conductive via portion 140V. The lateral width, D1, of the conductive via portion 140V is determined by the width of the sacrificial line 130 and its length is determined by the patterned length of the cap layer 145.

FIGS. 1H and 2H illustrate the device after several processes were performed to form additional dielectric material, such as additional material of the dielectric layer 125, to cover the recessed conductive lines 140R, 140A. For example, a deposition process may be performed, followed by a planarizing process or an etch process to expose the conductive via portion 140V. This process operation removes the cap layer 145.

Figure 2I:
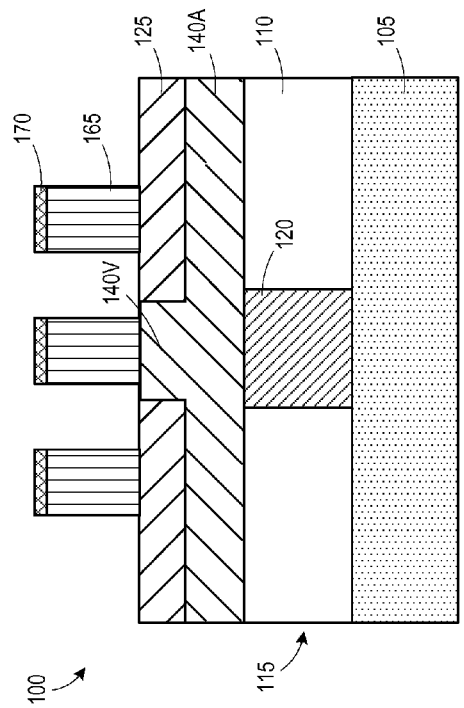

FIGS. 1I and 2I illustrate the device 100 after performing a plurality of processes so as to form a second set of sacrificial lines 165 with a cap layer 170 formed thereabove. The orientation of FIG. 1I is indicated by the center line in FIG. 2I. The sacrificial lines 165 are oriented perpendicularly with respect to the sacrificial lines 130 illustrated in FIG. 1A. The sacrificial lines 165 may be formed by patterning a layer of material (e.g., amorphous silicon) using a patterning process (e.g., self-aligned double patterning (SADP), self-aligned quad patterning (SAQD), or directed self-assembly material patterning), the specifics of which are known to those of ordinary skill in the art.

Figure 1J:
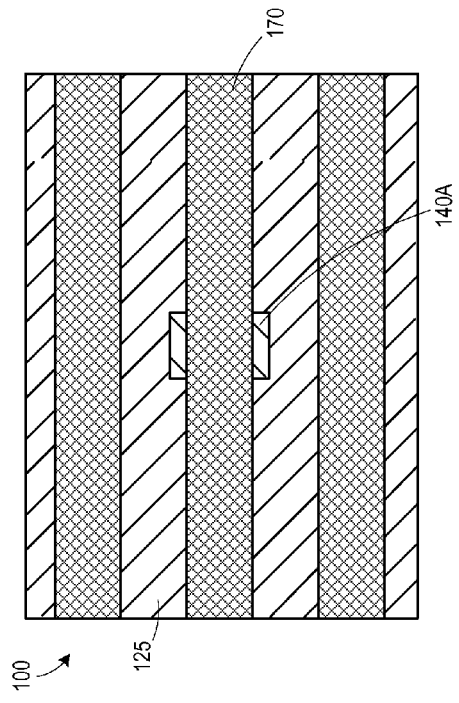
Figure 2J:
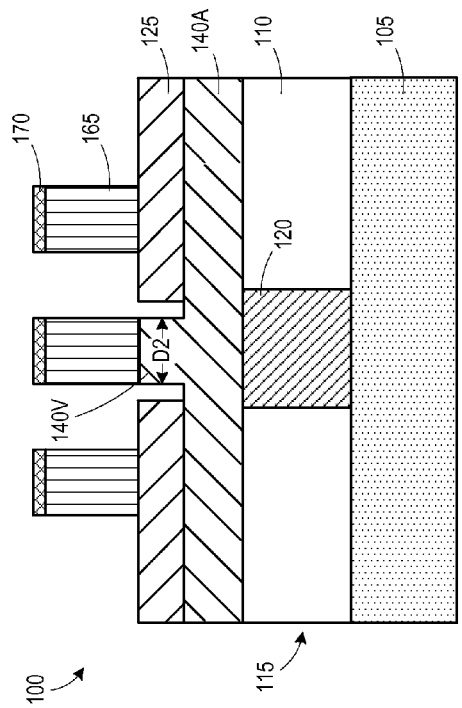

FIGS. 1J and 2J illustrate the device 100 after performing a recess etch on the exposed portions of the conductive via portion 140V using the sacrificial lines 165 as an etch mask. The recess etch reduces the length, D2, of the conductive via portion 140V corresponding to the width of the sacrificial line 165. Thus, the horizontal cross-sectional dimensions of the conductive via portion 140V are defined by the respective widths of the sacrificial line 130 (see FIG. 1F) and the perpendicularly orientated sacrificial line 165. The etching processes for forming the conductive via portion 140V are self-aligned based on the sacrificial lines 130, 165.

Figure 2K:
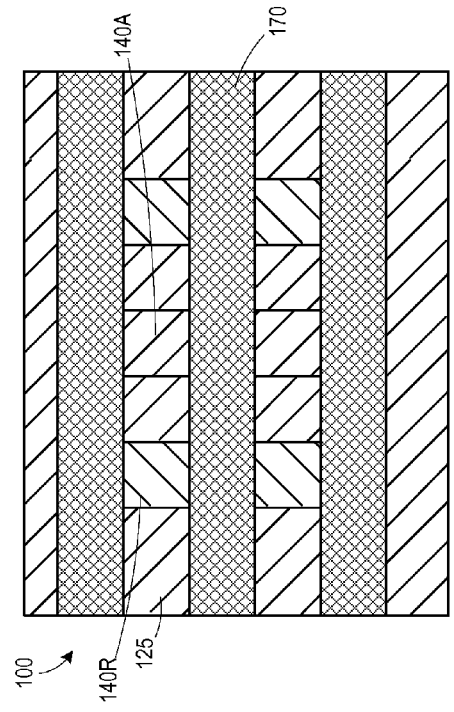
Figure 1K:
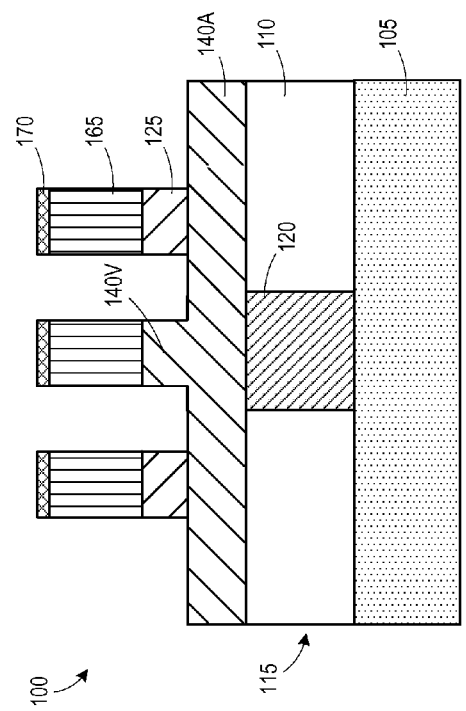

FIGS. 1K and 2K illustrate the device 100 after performing an optional recess etch of the dielectric layer 125 using the sacrificial lines 165 as an etch mask. The dielectric recess etch exposes the recessed metal features 140R and 140A. In some embodiments, the dielectric recess etch may be performed prior to the conductive material recess etch described in FIGS. 1J and 2J. In such an embodiment, further recessing of the recessed metal features 140R would occur in portions not covered by the sacrificial lines 165 during the conductive material recess etch, as they would already be exposed. In some embodiments, the same etch process may be used to recess the conductive via portion 140V and the dielectric layer 125, where the etch process is not selective to the conductive material 140 compared to the dielectric layer 125.

Figure 2L:
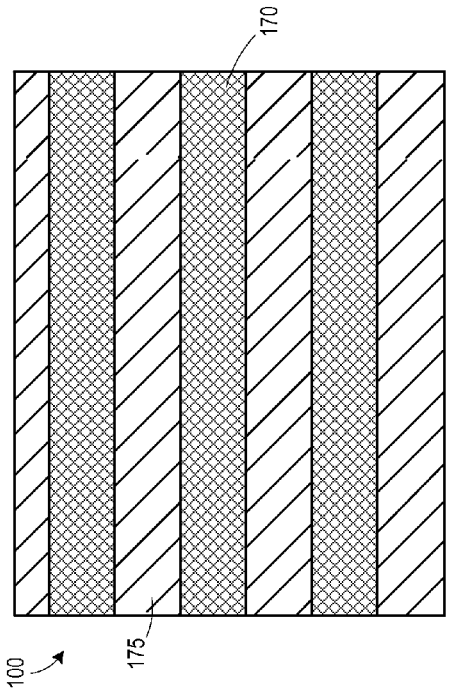
Figure 1L:
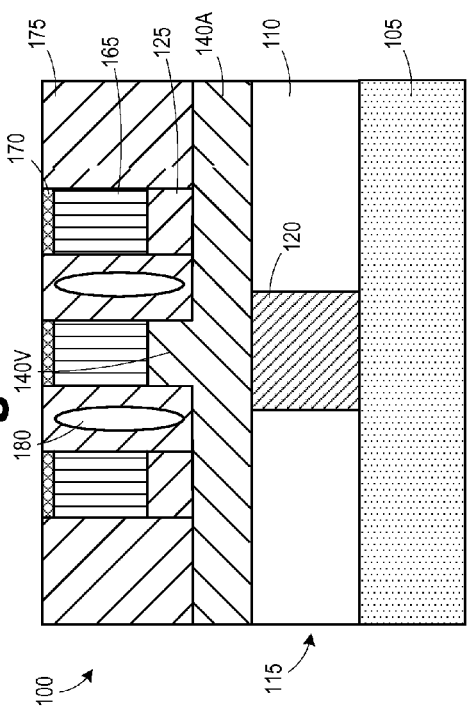

FIGS. 1L and 2L illustrate the device 100 after performing a plurality of processes to form a second dielectric layer 175 (e.g., in a Metal 2 (M2) layer). The dielectric layer 175 may be deposited to extend above the sacrificial lines 165 and a planarization process or a recess etch may be performed to remove the portion extending above the sacrificial lines 165. Due to the aspect ratio of the openings defined between the sacrificial lines 165, the dielectric layer 175 may not completely fill the openings, resulting in air gaps 180 between the sacrificial lines 165. The air gaps 180 reduce the capacitance of the device 100, thereby increasing switching speed, and as a result, performance. The use of the dielectric etch process illustrated in FIGS. 1K and 2K increases the size of the air gaps 180.

FIGS. 1M and 2M illustrate the device 100 after several processes were performed to replace the sacrificial lines 165 with conductive material to define conductive lines 185. First, one or more etch processes were performed to remove the cap layer 170 and the sacrificial lines 165, resulting in recesses. Next, one or more deposition processes were performed so as to over-fill the recesses with a conductive material. Then, a planarization process was performed to remove excess conductive material. The conductive lines 185 may include multiple layers, such as one or more barrier layers (e.g., Ta, TaN, TiN, etc.) to prevent migration of any metal in the conductive lines 185 into the dielectric layer 175, a metal seed layer (e.g., copper), and a metal fill material (e.g., copper). One of the conductive lines 185A interfaces with the conductive via portion 140V. Thus, the conductive via portion 140V connects the conductive line 140A in the M1 layer to the conductive line 185A in the M2 layer.

Subsequent processes may be performed to complete the fabrication of the device 100, such as forming additional metallization layers, die singulation, and packaging. The use of the illustrated process provides self-aligned control of the via formation process. The use of the sacrificial lines 130, 165 prevents via misalignment in both the x and y directions. The use of the sacrificial material 160 to pattern the cap layer 145 allows the cap layer 145 to be completely removed from between the first and second dielectric layers 125, 175, thereby reducing the capacitance of the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method comprising:
  forming a first dielectric layer having at least one conductive feature embedded therein;
  forming a first plurality of conductive lines embedded in a second dielectric layer disposed above said first dielectric layer, wherein a first conductive line in said plurality of conductive lines contacts said conductive feature;

etching said first conductive line using a first etch mask to define a conductive via portion and a recessed line portion in said first conductive line; and forming a second plurality of conductive lines embedded in a third dielectric layer disposed above said second dielectric layer, wherein a second conductive line in said second plurality of conductive lines contacts said conductive via portion and said third dielectric layer directly contacts said second dielectric layer wherein said conductive via portion has a first cross-sectional dimension corresponding to a width of said first conductive line and a second cross-sectional dimension corresponding to a width of said second conductive line.

2. The method of claim 1, wherein said etching said first conductive line using said first etch mask further comprises:

forming a cap layer above said second dielectric layer;

forming a second etch mask above a portion of said cap layer disposed above said first conductive line;

etching said cap layer to remove portions of said cap layer not covered by said second etch mask to define said first etch mask below said second etch mask based on a remaining portion of said cap layer; and removing said second etch mask after etching said first conductive line.

3. The method of claim 1, wherein said forming said first plurality of conductive lines further comprises:

forming a plurality of sacrificial lines above said first dielectric layer;

forming said second dielectric layer above said plurality of sacrificial lines, wherein air gaps are disposed in said second dielectric layer between pairs of adjacent sacrificial lines;

planarizing said second dielectric layer to expose a top surface of said plurality of sacrificial lines; and replacing said plurality of sacrificial lines with a conductive material to define said plurality of conductive lines.

4. The method of claim 1, wherein said forming said second plurality of conductive lines comprises:

forming a plurality of sacrificial lines above said second dielectric layer;

etching said second dielectric layer using said plurality of sacrificial lines as an etch mask to remove a portion of said second dielectric layer exposed between adjacent sacrificial lines;

forming said third dielectric layer above said plurality of sacrificial lines, wherein air gaps are disposed in said third dielectric layer between pairs of adjacent sacrificial lines;

planarizing said third dielectric layer to expose a top surface of said plurality of sacrificial lines; and replacing said plurality of sacrificial lines with a conductive material.

5. The method of claim 4, wherein said etching of said first conductive line and said etching of said second dielectric layer are performed concurrently.

6. The method of claim 4, wherein said etching of said first conductive line occurs prior to said etching of said second dielectric layer.

7. The method of claim 1, wherein said forming said second plurality of conductive lines further comprises:

forming a plurality of sacrificial lines above said second dielectric layer, wherein a first sacrificial line in said plurality of sacrificial lines contacts said first conductive via portion, wherein said first sacrificial line has a width less than a first cross-sectional dimension of said first conductive via portion and a portion of said first conductive via portion is exposed; and etching said exposed portion of said first conductive via portion using said first sacrificial line as an etch mask.

8. The method of claim 7, further comprising replacing said first sacrificial line with a conductive material to define said second conductive line.

9. A method comprising:

forming a first dielectric layer having at least one conductive feature embedded therein;

forming a first plurality of conductive lines embedded in a second dielectric layer disposed above said first dielectric layer, wherein a first conductive line in said plurality of conductive lines contacts said conductive feature;

forming a cap layer above said second dielectric layer;

forming a first etch mask above a portion of said cap layer disposed above said first conductive line;

etching said cap layer to remove portions of said cap layer not covered by said first etch mask to define a second etch mask below said first etch mask based on a remaining portion of said cap layer;

etching said first conductive line using said first etch mask to define a conductive via portion and a recessed line portion in said first conductive line;

removing said second etch mask after etching said first conductive line; and forming a second plurality of conductive lines perpendicular to said first plurality of conductive lines and embedded in a third dielectric layer disposed above said second dielectric layer, wherein a second conductive line in said second plurality of conductive lines contacts said conductive via portion and said third dielectric layer directly contacts said second dielectric layer, wherein said conductive via portion has a first cross-sectional dimension corresponding to a width of said first conductive line and a second cross-sectional dimension corresponding to a width of said second conductive line.

10. The method of claim 9, wherein said forming said first plurality of conductive lines further comprises:

forming a plurality of sacrificial lines above said first dielectric layer;

forming said second dielectric layer above said plurality of sacrificial lines, wherein air gaps are disposed in said second dielectric layer between pairs of adjacent sacrificial lines;

planarizing said second dielectric layer to expose a top surface of said plurality of sacrificial lines; and replacing said plurality of sacrificial lines with a conductive material to define said plurality of conductive lines.

11. The method of claim 9, wherein said forming said second plurality of conductive lines comprises:

forming a plurality of sacrificial lines above said second dielectric layer;

etching said second dielectric layer using said plurality of sacrificial lines as an etch mask to remove a portion of said second dielectric layer exposed between adjacent sacrificial lines;

forming said third dielectric layer above said plurality of sacrificial lines, wherein air gaps are disposed in said third dielectric layer between pairs of adjacent sacrificial lines;

planarizing said third dielectric layer to expose a top surface of said plurality of sacrificial lines; and replacing said plurality of sacrificial lines with a conductive material.

12. The method of claim 11, wherein said etching of said first conductive line and said etching of said second dielectric layer are performed concurrently.

13. The method of claim 11, wherein said etching of said first conductive line occurs prior to said etching of said second dielectric layer.

14. The method of claim 9, wherein said forming said second plurality of conductive lines further comprises:
   forming a plurality of sacrificial lines above said second dielectric layer, wherein a first sacrificial line in said plurality of sacrificial lines contacts said first conductive via portion, wherein said first sacrificial line has a width less than a first cross-sectional dimension of said first conductive via portion and a portion of said first conductive via portion is exposed; and
   etching said exposed portion of said first conductive via portion using said first sacrificial line as an etch mask.

\* \* \* \* \*